United States Patent
Vasavda et al.

(10) Patent No.: US 7,136,289 B2
(45) Date of Patent: Nov. 14, 2006

(54) DUAL-STACKED 10 GIGABIT X2 UPLINKS IN A SINGLE RACK UNIT SWITCH

(75) Inventors: Samir Vasavda, Fremont, CA (US); William F. Edwards, Jr., Livermore, CA (US); Michael Kornprobst, Pleasanton, CA (US); David Nelsen, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 124 days.

(21) Appl. No.: 10/931,124

(22) Filed: Aug. 30, 2004

(65) Prior Publication Data

US 2006/0044774 A1 Mar. 2, 2006

(51) Int. Cl.
*H05K 1/14* (2006.01)
(52) U.S. Cl. ............... 361/742; 361/758; 361/770; 361/804; 361/809; 361/760; 439/564; 439/573; 439/541.5; 385/92
(58) Field of Classification Search ................ 439/65, 439/75, 74, 219, 573, 564, 570, 607; 361/742, 361/758, 770, 804, 807–809; 385/88, 92
See application file for complete search history.

(56) References Cited

U.S. PATENT DOCUMENTS 5,757,998 A * 5/1998 Thatcher et al. ............. 385/75
6,047,172 A * 4/2000 Babineau et al. ............ 455/300
6,366,471 B1 * 4/2002 Edwards et al. ............ 361/796
6,469,905 B1 * 10/2002 Hwang ....................... 361/756
6,558,191 B1 * 5/2003 Bright et al. ............. 439/541.5
6,600,865 B1 * 7/2003 Hwang ....................... 385/134
6,711,030 B1 * 3/2004 Akiba ........................ 361/803
6,778,399 B1 * 8/2004 Medina et al. .............. 361/729
6,811,326 B1 * 11/2004 Keeble et al. ................ 385/92

OTHER PUBLICATIONS

X2 MSA 10 Gigabit, *Quick Introduction to the X2 MSA*, X2 Concept Overview, Revision 1.1, downloaded from the Internet: <http://x2msa.org/X2_Introduction1_1_.pdf>.
X2 MSA 10 Gigabit, *A Cooperation Agreement for a Small Versatile 10 Gigabit Transceiver Package*, Issue 1.0b, Feb. 28, 2003, downloaded from the Internet: <http://x2msa.org/X2MSA_Rev1.0b.pdf>.

* cited by examiner

*Primary Examiner*—Kamand Cuneo
*Assistant Examiner*—Dameon E. Levi
(74) *Attorney, Agent, or Firm*—Charles E. Krueger

(57) ABSTRACT

A system for providing dual 10 GB uplinks in the front side of a single rack unit switch that stacks two MSA X2 I/O devices in a limited space. In one embodiment the two X2 I/O devices are mounted on opposite sides of a single circuit board positioned above the motherboard.

3 Claims, 2 Drawing Sheets

DUAL-STACKED 10 GIGABIT X2 UPLINKS IN A SINGLE RACK UNIT SWITCH

BACKGROUND OF THE INVENTION

Single rack unit (1 RU) switches, or pizza boxes, are ubiquitous in offices and businesses and there has been a push by manufacturer's to add more and more features while driving down costs. Current 1 RU switches provide 48 ports for connecting to end-devices. Additionally, the units must provide uplinks to connect to backbone or core routers or switches. Generally, two uplinks are required to provide redundancy.

The dimensions of the front face of a single RU switch are only 1.75"×17.5". The actual space available for 48 ports and uplinks is smaller because the product itself includes a bezel facing that includes graphics and other items comprising a user interface that is similar to previous products.

Previous uplink I/O devices, such as the GBIC (Gigabit Interface Converter) or the SFP (Small Form Factor Pluggable) module, have a relatively small form factor and sufficient space is available on the front face of the 1 RU switch for both the 48 ports and the dual uplinks. However, with the advent of 10 Gigabit Ethernet (10 GE) the uplink I/O device size has increased.

One type of 10 GE uplink I/O device is the MSA (Multi-Source Agreement) X2, which is defined in the X2 MSA specification which is hereby incorporated by reference. The X2 system utilizes a side rail support system which is mounted on a PCB (printed circuit board) with a connector disposed to receive the connector end of the X2 transceiver. The X2 transceiver is inserted into a switch and guided by the rail system so the X2 transceiver connector mates with the PCB connector. The module includes a bezel on the front which is used to hold a gasket for EMI protection.

Because of the increased size of the X2 10 GE I/O device it has not been possible to provide two 10 GE uplinks in a 48 port 1 RU switch.

BRIEF SUMMARY OF THE INVENTION

In one embodiment of the invention, two X2 modules are mounted "belly to belly" on opposite sides of a dual-sided PCB. The dual-sided PCB is mounted above the motherboard using vertical supports and is connected to the motherboard using a vertical connector.

In another embodiment of the invention, the dual-sided PCB has a thickness of about 0.2 inches to provide clearance between the front bezels of the X2 modules and provide structural support for the X2 modules.

In another embodiment of the invention, ribbon connectors are utilized to couple the X2 modules to the motherboard.

In another embodiment of the invention, the motherboard is cut out below the PCB module to provide extra space for ventilation.

In another embodiment of the invention, the modules have the same orientation and the upper module is mounted on the upper surface of an upper PCB which is connected to the motherboard using an interposer connector.

In another embodiment of the invention, the modules have opposite orientation with the upper module connected on the lower surface of an upper PCB which is connected to the motherboard using a interposer connector.

Other features and advantages of the invention will be apparent in view of the following detailed description and appended drawings.

DETAILED DESCRIPTION OF THE INVENTION

Figure 1:
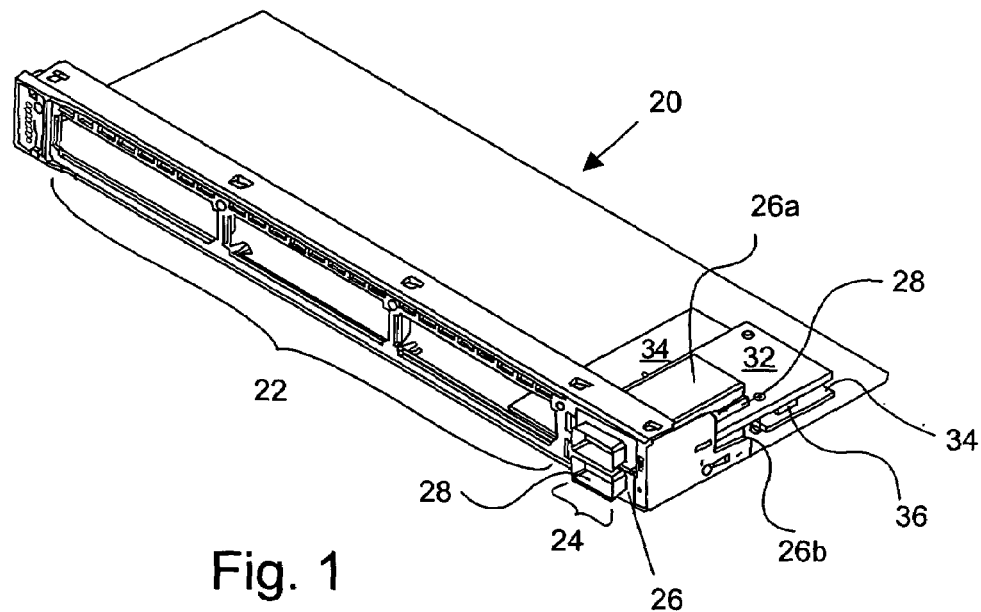
FIG. 1 is a perspective view of an embodiment of the invention.

Reference will now be made in detail to various embodiments of the invention. Examples of these embodiments are illustrated in the accompanying drawings where like reference numerals denote the same or similar components. While the invention will be described in conjunction with these embodiments, it will be understood that it is not intended to limit the invention to any embodiment. On the contrary, it is intended to cover alternatives, modifications, and equivalents as may be included within the spirit and scope of the invention as defined by the appended claims. In the following description, numerous specific details are set forth in order to provide a thorough understanding of the various embodiments. However, the present invention may be practiced without some or all of these specific details. In other instances, well known process operations have not been described in detail in order not to unnecessarily obscure the present invention.

FIG. 1 is a perspective view of an embodiment of the invention. A 1 RU switch 20 has a front face having a first region 22 for holding 48 ports and a second region 24 for holding 2 MSA X2 10 GE uplink modules 26*a* and *b*. The front face also has space reserved for a user interface or console interface to be compatible with existing products.

The X2 modules 26*a* and *b* are mounted on a PCB board using rails 28. In this embodiment the MidPak version of X2 defined in X2MS revision 1.0b dated 28 Feb. 2003 is utilized. The front of the module includes a bezel 26 and a receptacle 28 for receiving Tx and Rx connector plugs. The bezel abuts the front plate 22 of the switch. The X2 module includes fins for cooling. An MSA XENPAK 70 pin connector connects the electrical circuitry in the X2 module to the traces on the printed circuit board.

First and second X2 modules 26*a* and 26*b* are mounted "belly to belly" on a dual-sided PCB 32 which is connected to a motherboard 34 by a vertical connector 36 which connects traces on both sides of the dual-sided PCB 32 to traces on the motherboard 34.

Figure 2:
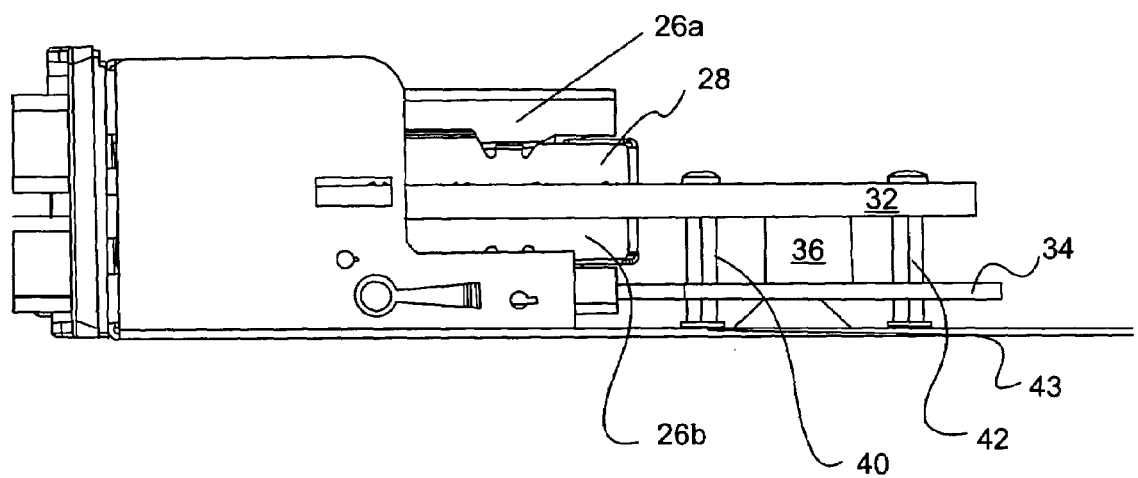
FIG. 2 is a detailed side-view of an embodiment of the invention.

FIG. 2 is a side view of the embodiment depicted in FIG. 1. The dual-sided PCB 32 is positioned above the motherboard by spacers 40 and 42 connected to the chassis 43. In this embodiment the thickness of the dual-sided PCB is about 0.200 inches to provide separation between the bezels 26 of the first and second X2 modules 26*a* and *b* and to provide mechanical support. In one embodiment, depicted in FIG. 3, the motherboard 34 is partially cut away below the modules so only three or four supports are available to support the dual-sided PCB 32.

Figure 3:
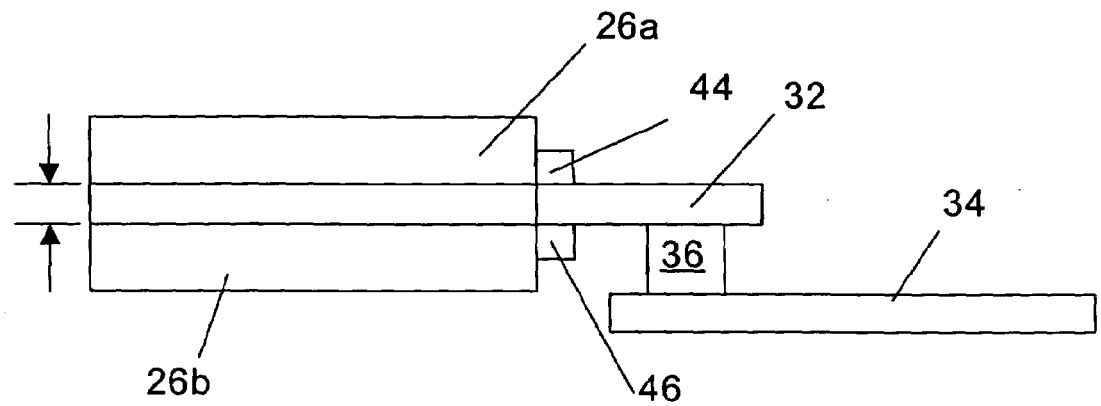
FIG. 3 is a side view of an embodiment of the invention having a cut-away motherboard.

As depicted in FIG. 3 the first X2 module 26a is connected to a first XENPAK connector 44 which connects circuitry in the first X2 module to the traces on the upper surface of the dual-sided PCB 32 and the second X2 module 26b is connected to a second XENPAK connector 46 which connects circuitry in the second X2 module to the traces on the lower surface of the dual-sided PCB 32.

The space required by the 48 front mounted ports in the 1 RU switch requires that the dual 10 GE uplinks be stacked because there is not enough horizontal space in the front of the 1 RU switch, due to constraints such as the inclusion of a mode button, graphics, and other components forming a user interface similar to other products, to allow the modules to be disposed side-by-side.

In the "belly to belly" configuration depicted in FIGS. 1 and 2, the second X2 26b module is mounted upside down relative to the first X2 module 26a. A relatively thick PCB is required to support the second module stacked over the first. By mounting the X2 modules on the top and bottom sides of the dual-sided PCB 32 it is possible to stack the two modules in the small area 24 of the front face of the 1 RU switch that is not occupied by the 48 ports.

When using optical components sufficient cooling is critical to prevent signal degradation or loss of packets. The configuration depicted in FIGS. 1 and 2 provides sufficient space to allow necessary air circulation to cool the components with the modules.

In an alternative embodiment, the first and second X2 modules 26 and 28 can be connected to the motherboard by ribbon connectors.

Figure 4:
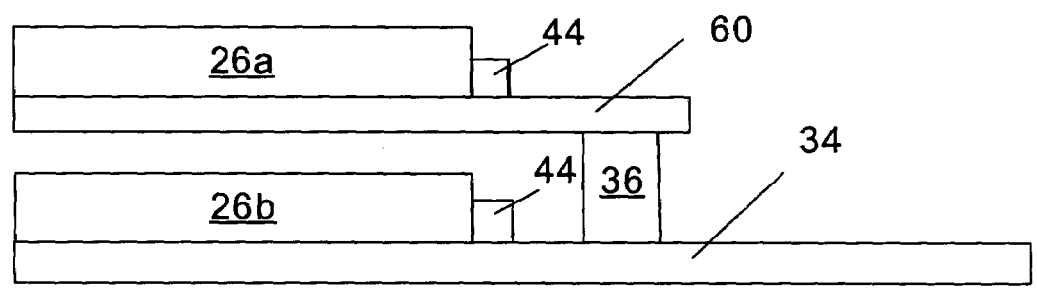
FIG. 4 is a side view of another embodiment of the invention.

In a second embodiment of the invention, depicted in FIG. 4, the first X2 module 26a is mounted on the top surface of a one-sided PCB 60 and the second X2 module 26b is mounted on the motherboard 34. A vertical connector 36 connects the one-sided PCB 60 to the motherboard. Alternatively, the first module 26a can be connected to the motherboard by a ribbon connector (not shown).

Figure 5:
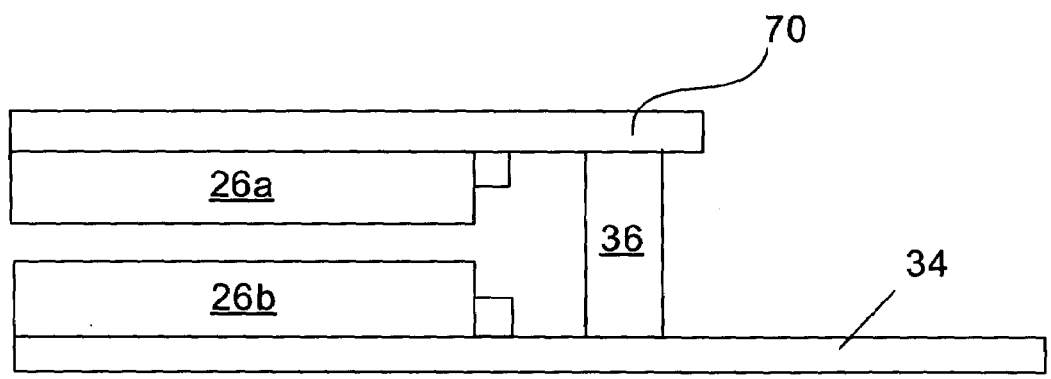
FIG. 5 is a side view of still another embodiment of the invention.

In a third embodiment, depicted in FIG. 5, the first module 26a is connected to the underside of a one-sided PCB 70 and the one-sided PCB is connected to the motherboard by either a vertical connector 36 or a ribbon connector (not shown). The second X2 module 26b is mounted on the motherboard 34.

The invention has now been described with reference to the preferred embodiments. Alternatives and substitutions will now be apparent to persons of skill in the art. Accordingly, it is not intended to limit the invention except as provided by the appended claims.

What is claimed is:

1. A system providing dual X2 10 Gigabit uplink I/O devices in a limited area on the front surface of the chassis of a single rack-unit switch, with a motherboard included in the switch, said system comprising:

a dual-sided printed circuit board, having an upper side and a lower side;

a first connector mounted on the upper side and a second connector mounted on the lower side of the dual-sided circuit board a first X2 module mounted on the upper side of the dual-sided circuit board and coupled to the first connector;

a second X2 module mounted on the lower side of the dual-sided circuit board and coupled to the second connector;

a mechanical support, connected to the bottom of the chassis and passing through the motherboard, for holding the dual-sided circuit board above the motherboard to create a space between the second X2 module and the motherboard; and a vertical connector connecting the dual-sided circuit board to the motherboard.

2. The system of claim 1 where the dual-sided circuit board is about 0.2 inches thick.

3. A system providing dual X2 10 Gigabit uplink I/O devices in a limited area on the front surface of the chassis of a single rack-unit switch, with a motherboard included in the switch, said system comprising:

a dual-sided printed circuit board, having an upper side and a lower side;

a first X2 module mounted on the upper side of the dual-sided circuit board;

a second X2 module mounted on the lower side of the dual-sided circuit board;

a mechanical support, connected to the bottom of the chassis and passing through the motherboard, for holding the dual-sided circuit board above the motherboard to create a space between the second X2 module and the motherboard; and a first ribbon connector mounted coupling the first X2 module to the motherboard and a second ribbon connector mounted coupling the second X2 module to the motherboard.

* * * * *